United States Patent [19]
Morzano et al.

[11] Patent Number: 5,886,940
[45] Date of Patent: Mar. 23, 1999

[54] SELF-PROTECTED CIRCUIT FOR NON-SELECTED PROGRAMMABLE ELEMENTS DURING PROGRAMMING

[75] Inventors: Christopher Morzano; Wen Li, both of Boise, Id.

[73] Assignee: Micron Technology, Inc., Boise, Id.

[21] Appl. No.: 916,835

[22] Filed: Aug. 21, 1997

[51] Int. Cl.$^6$ ..................................................... G11C 8/00
[52] U.S. Cl. .................. 365/230.03; 365/204; 365/225.7
[58] Field of Search ........................... 365/230.03, 225.7, 365/200, 203, 204

[56] References Cited

U.S. PATENT DOCUMENTS

| | | | |
|---|---|---|---|
| 5,311,472 | 5/1994 | Ota | 365/225.7 |
| 5,621,691 | 4/1997 | Park | 365/200 |
| 5,689,463 | 11/1997 | Muramaki et al. | 365/200 |
| 5,696,723 | 12/1997 | Tukahara | 365/225.7 |
| 5,724,282 | 3/1998 | Loughmiller et al. | 365/225.7 |
| 5,801,574 | 9/1998 | Martin et al. | 365/225.7 |

*Primary Examiner*—Son T. Dinh
*Attorney, Agent, or Firm*—Seed and Berry LLP

[57] ABSTRACT

A circuit is provided for programming antifuses while preventing other antifuses from being inadvertently programmed or stressed. The antifuses and programming circuits are arranged in a plurality of banks, each of which contains a plurality of programming circuits corresponding in number to the number of bits of an address signal. The bits of the address signal are applied to corresponding programming circuits in all of the banks. The programming circuits each include a antifuse select transistor coupling its respective antifuse to a bank select node for the bank. The antifuses in one of the banks are programmed by coupling the bank select node for that bank to ground through a bank select transistor. The antifuse select transistor in the programming circuit and the bank select transistor thus complete a current path from a programming node, through the antifuse and transistors to ground. However, the interconnection of the bank select transistor and the antifuse select transistor has a relatively high parasitic capacitance. As a result, significant current can be capacitively coupled through the bank select transistor of the nonselected bank, thereby inadvertently programming the antifuses in the nonselected bank. Inadvertent programming of antifuses in the nonselected bank is avoided by charging the parasitic capacitances of the bank select nodes in the nonselected banks. As a result, the antifuse select transistors in each of the programming circuits are maintained in an OFF condition, and the voltage across the parasitic capacitances remains relatively constant, thereby limiting the current flowing through the parasitic capacitances.

41 Claims, 7 Drawing Sheets

SELF-PROTECTED CIRCUIT FOR NON-SELECTED PROGRAMMABLE ELEMENTS DURING PROGRAMMING

TECHNICAL FIELD

The present invention relates to integrated circuit devices containing programmable elements such as antifuses, and more particularly, to integrated circuits using programmable elements to alter their functions such as in a memory device to select redundant memory cells to replace defective memory cells.

BACKGROUND OF THE INVENTION

Conventional integrated circuit memories contain individual memory cells arranged in an array of rows and columns. Occasionally, fabrication defects render one or more cells inoperative. To boost production yields, several redundant rows and columns of cells are integrated into the memory array to be used as substitutes for the defective rows or columns. After identifying the defective row or column, a redundant row or column is substituted for the row or column containing the defect. This substitution requires the programmable devices, such as fuses or antifuses, to identify the defective rows or columns for which a redundant row or column is to be substituted.

Antifuses are capacitive-type structures, an example of which is shown in FIG. 1. As shown in FIG. 1, an electronic circuit 2 contains an antifuse 4 which includes a pair of conductive plates 6 and 8 and a dielectric material 9 between the plates. The conductive plates 6, 8 may be made from doped silicon, polysilicon, metal or another conductive material with similar properties. The dielectric material 9 may be made from oxide, nitride, nitride-oxide, oxide-nitride-oxide, undoped amorphous silicon, or equivalents thereof In an unprogrammed state, the antifuse 4 is non-conductive and has a resistance of over 1 mega-ohm across the plates 6, 8. To program the antifuse 4, a relatively high electric field is applied across the plates 6, 8. The high electric field causes the breakdown and melting of a portion of the dielectric material 9, and the two plates 6, 8 of the antifuse 4 flow, contacting each other and creating a low-resistance path. Essentially, the breakdown of the dielectric material 9 occurs at an area in which the composition of the material is most defective. Therefore, blown antifuses conduct and unblown antifuses do not conduct.

As mentioned above, fuses (not shown) are also used to identify defective rows or columns in a memory device for which a redundant row or column is to be substituted. Fuses are basically conductive paths that are opened and thus made non-conductive by applying a sufficiently large voltage and current to the fuse.

FIG. 2A shows a part of a conventional substitute memory cell enabling circuit array 10. The enabling circuit array 10 shown in FIG. 2A is capable of selecting up to three substitute rows or columns using three respective banks 12, 14, 16 of programming circuits 20a, b . . . n. It will be understood, however, that a lesser or greater number of banks 12, 14, 16 may be used to enable a lesser or greater number of substitute rows or columns.

The number of programming circuits 20 in each bank 12, 14, 16 corresponds to the number of bits in an address designating the defective row or column. The corresponding programming circuits 20a, b, . . . n in each bank 12, 14, 16 receive a respective address bit $A_0, A_1, \ldots A_n$. The address received in the address bits $A_0, A_1, \ldots A_n$ of the bank 12, 14, 16 are not necessarily the same as the row or column address of the defective row or column. All of the programming circuits 20a, b, . . . n in each bank 12, 14, 16 are enabled by a respective NMOS bank select transistor 22, 24, 26. The conductive state of each bank select transistor 22, 24, 26 is controlled by a respective enable inputs $En_0$, $En_1$, $En_2$.

Each programming circuit 20 also includes an antifuse 4 having a air of plates 6, 8 as explained above with reference to FIG. 1. The plate 6 of each antifuse 4 is connected to a circuit ground node 30. The circuit ground nodes 30 of all of the programming circuits 20 are connected to each other and to a circuit ground $C_{GND}$ input. The other plate 8 of the antifuse 4 is connected through a voltage clamping transistor 36 and an antifuse select transistor 38 to the drain of one of the bank select transistors 22, 24, 26. The gate of each voltage clamping transistor 36 is coupled to an elevated supply voltage $V_{CCP}$. The elevated supply voltage $V_{CCP}$ is normally generated from a supply voltage $V_{CC}$ using a charge pump or similar circuit, although it may be generated from any source. The gate of each antifuse select transistor 38 in one bank is connected to the gates of corresponding antifuse select transistors 38 in other banks. Thus, for example, the gates of the antifuse select transistors 38 in the programming circuits 20a are all connected to each other and to the $A_0$ input.

The manner in which the antifuses 4 are programmed to correspond to the addresses of defective rows or columns will now be explained. Initially, the antifuse select transistors 38 and the bank select transistors 22, 24, 26 are all OFF. When the memory cell enabling array 10 is ready for programming, a relatively large programming voltage is applied to the $C_{GND}$ terminal and a logic "1" is applied to one of the enable inputs $En_0$–$En_2$ to turn on the corresponding bank select transistor 22, 24, 26. The bank select transistor, for example transistor 22, pulls the source of each antifuse select transistor 38 in the bank 12 to ground. At this time, the plate 6 of the antifuse 4 in each programming circuit 20 in the bank 12 is coupled to the relatively high programming voltage while the plate 8 in each programming circuit 20 is isolated from ground by its respective antifuse select transistor 38.

The final programming step is turning ON the antifuse select transistors 38. A pattern of address bits $A_0$–$A_n$ is applied to the gates of the antifuse select transistors 38 in all of the programming circuits 20. The antifuse select transistors 38 receiving a high gate voltage are turned ON, thereby completing the circuit path from the plate 8 of the antifuse 4 to ground in the enabled bank 12 in which the bank select transistor 22 is turned ON. As a result, the full magnitude of the programming voltage on the $C_{GND}$ terminal is applied between the plates 6, 8 of selected antifuses 4 in the bank 12. The resulting electric field causes a breakdown of the dielectric material 9, thereby forming a low-resistance path across the antifuses 4. Although the antifuse select transistors 38 are selectively turned ON in the remaining banks 14, 16, the plates 8 of the antifuses in these banks are isolated from ground by the OFF bank select transistors 14, 16.

After the substitute memory cell enabling array 10 has been programmed as described above, it is used to identify row or column addresses corresponding to defective rows or columns for which a substitute row or column must be used. A sensing circuit (not shown) determines whether antifuses 4 have been blown in the pattern of the address by applying the bits of the address to respective antifuses 4 in all of the banks 12, 14, 16. The sensing circuit (not shown) uses a logic circuit to combine the resulting signals from all of the antifuses 4 in each bank to determine if the antifuses 4 in any of the banks 12, 14, 16 are programmed in the same pattern as the address. If the address matches one of the addresses that has been programmed into the antifuses 4, the output of the logic gate changes state and enables a substitute row or column of memory cells.

One of the inherent problems with the prior art substitute memory cell enable array 10 shown in FIG. 2A is the unintended programming of antifuses 4. This problem is best explained with reference to FIGS. 2B and 2C. FIG. 2B shows the programming circuit 20 in a non-selected bank 14 during programming of a selected bank 12, while FIG. 2C shows the voltages at various nodes in the circuit of FIG. 2B.

During programming of the antifuse 4, the programming voltage applied to the circuit ground node 30 is applied to the plate 6 of the antifuse 4. Since the plate 8 is isolated from ground at this time because the antifuse select transistor 38 is OFF, the voltage on the plate 8 follows the rise of the voltage on the plate 6. At time $t_0$, the $A_0$ input to the gate of the antifuse select transistor 38 goes high to program the antifuse 4 in the corresponding programming circuit 20a of the enabled bank 12. However, since the gates of all antifuse select transistors 38 in corresponding programming circuits 20a are connected to each other, the antifuse select transistor 38 in the non-selected bank 14 also turns ON. Although the bank select transistor 24 of the non-selected bank 14 is OFF, the source of the transistor 38 is nevertheless coupled to ground by a parasitic capacitance 40 due to the relatively long interconnection between the drain of the bank select transistor 24 and the source of the antifuse select transistor 38. As a result, the voltage on the plate 8 is pulled to $V_O$ at time $t_0$, and gradually increases as the parasitic capacitance 40 charges. The voltage $V_O$ is substantially equal to the voltage $V_{CC}$ applied to the gate of the transistor 38 less its threshold voltage $V_T$. As the voltage on the parasitic capacitance 40 increases, the voltage at a node 44 increases to $V_{CCP}-V_T$, where $V_T$ is the threshold voltage of the transistor 36, as shown in FIG. 2C. When the voltage at node 44 reaches this level, the transistor 36 turns OFF. The voltage on a bank select node 46 across the parasitic capacitance 40 eventually rises to $V_{CC}-V_T$, where $V_T$ is the threshold voltage of the transistor 38, as also shown in FIG. 2C. At this point, the transistor 38 turns OFF.

It is significant that, up until the time that the transistors 36, 38 turn OFF, there is a substantial voltage across the antifuse 4 and a current path from the circuit ground node 30 to ground through the parasitic capacitance 40, the transistors 36, 38 and the antifuse 4. As a result, sufficient current can flow through the antifuse 4 to partially or completely blow the antifuse 4, or otherwise overstress the dielectric material 9 of the antifuse 4.

If an antifuse 4 is inadvertently programmed as described above, it may be possible to detect the error during testing of the memory device containing the substitute memory cell enabling array 10. However, the inadvertent programming of the antifuse 4 may be less than complete. In particular, the voltage inadvertently applied to an antifuse 4 as explained above may stress the dielectric material 9 in the antifuse 4, but not sufficiently to cause the antifuse to become sufficiently conductive to be perceived as being programmed. However, once stressed, the dielectric material 9 in the antifuse 4 may break down over time thus transitioning from a state that is perceived to be non-conductive to a state that is perceived to be conductive. Also, a partially programmed antifuse may be perceived as non-conductive under some conditions, such as supply voltage or temperature values, but be perceived as conductive under other conditions. Consequently, an antifuse 4 that is not intended to be programmed may be perceived as non-conductive during testing of an integrated circuit, but may be perceived as conductive during use of the integrated circuit.

Although the above discussion relates to the use of antifuses 4 in the substitute memory cell enable array 10, it is also applicable to other types of electrically programmed programming elements, such as fuses. In particular, a voltage applied to the $C_{GND}$ input to program a fuse (not shown) would result in a current through the fuse, the transistor 36, 38 and an ON bank select transistor, such as transistor 22, of the selected bank 12. However, the voltage applied to the fuses in non-selected banks, for example bank 14, would also be coupled through the transistors 36,38 in those banks to the parasitic capacitances 40 of the interconnections of the OFF bank select transistors 24, 26. The current flowing through the fuses to charge the parasitic capacitances 40 may, in some cases, be sufficient to completely or partially program the fuses in the non-selected banks 14, 16.

SUMMARY OF THE INVENTION

A protection circuit is provided for an integrated circuit having a plurality of banks of one-time programmable elements in which the programmable elements in a selected bank are programmed. The protection circuit protects the programmable elements in a non-selected bank from being programmed during the programming of the programmable elements in the selected bank. A programming node is coupled to one terminal of each of the programmable elements. The programming node is adapted to receive a programming voltage and apply the programming voltage to the programmable elements in all of the banks. A plurality of programmable element select switches in each bank are coupled between a respective bank select node for each bank and a second terminal of a respective programmable element. The programmable element select switches each having a control terminal, and the control terminals of corresponding programmable element select switches in each bank are coupled to each other so that a control signal is applied to all of the corresponding programmable elements in each bank. A plurality of bank select switches couple respective bank select nodes to a reference voltage responsive to a respective bank select signal. Each of the bank select switches has a parasitic capacitance between the bank select node and the reference voltage. During programming of the antifuses in the selected bank, the parasitic capacitances of the bank select switches for the non-selected banks are charged, thereby allowing current to flow through programmable elements in the non-selected bank. The current through programmable elements in the non-selected bank can inadvertently program the programmable elements in the non-selected bank. A plurality of charging circuits are coupled to respective bank select nodes. The charging circuits apply a charging voltage to respective parasitic capacitances of the non-selected bank select switches to maintain the programmable element select switches in the non-selected banks OFF and to reduce the charging of the parasitic capacitances of the non-selected bank select switches. The programmable elements are preferably antifuses, although other programmable elements may also be used.

DETAILED DESCRIPTION OF THE INVENTION

Figure 1:
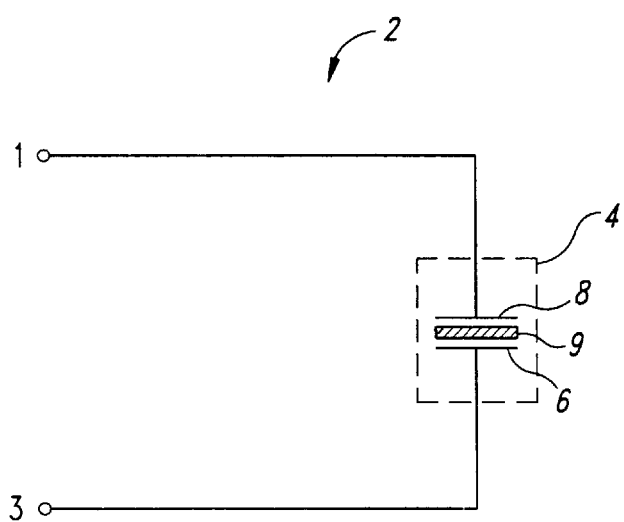
FIG. 1 is a schematic diagram of a one-time programmable antifuse according to the prior art.
Figure 2A:
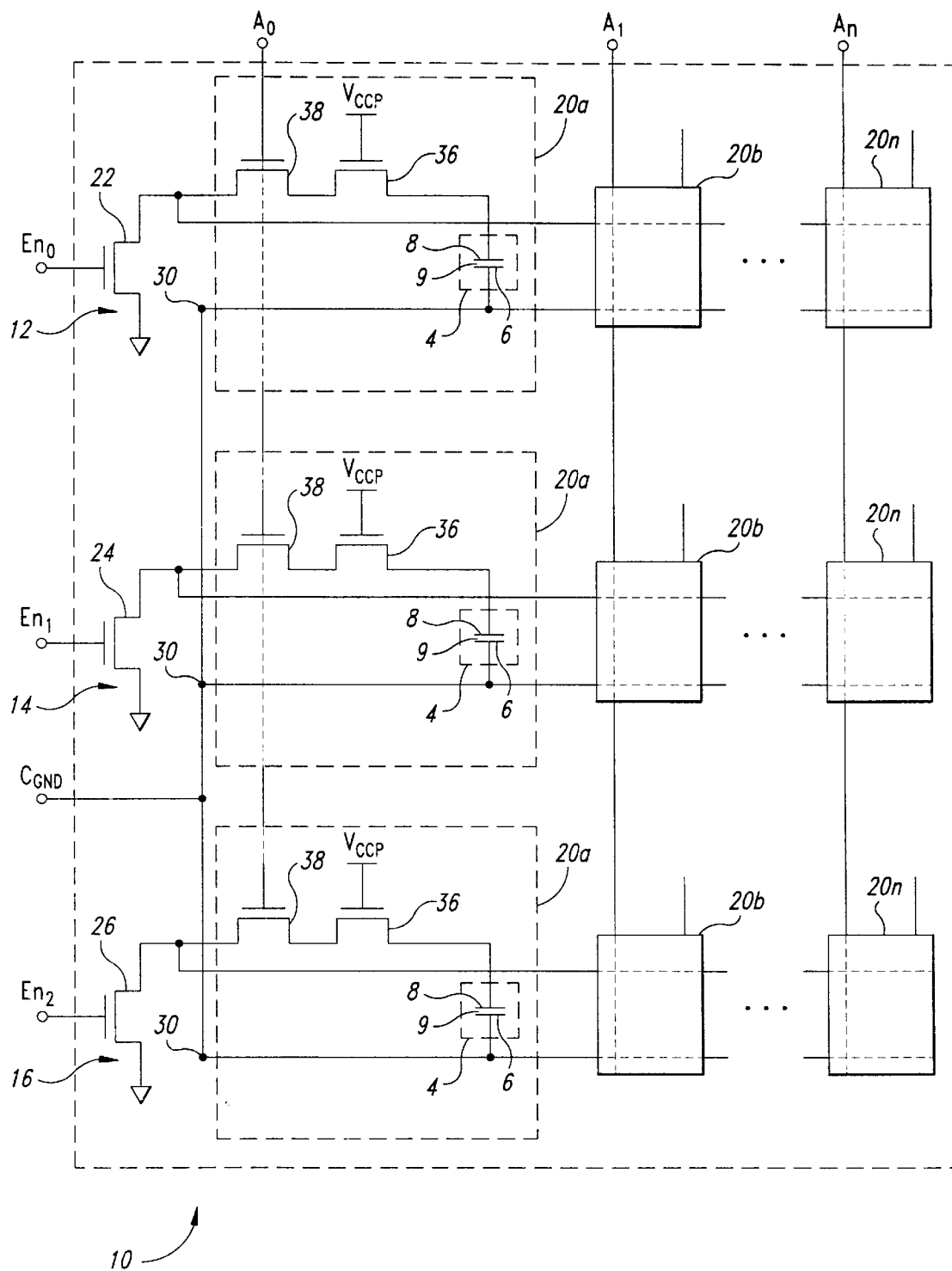
FIG. 2A is a schematic diagram of a substitute address enabling array including an antifuse according to the prior art.
Figure 2B:
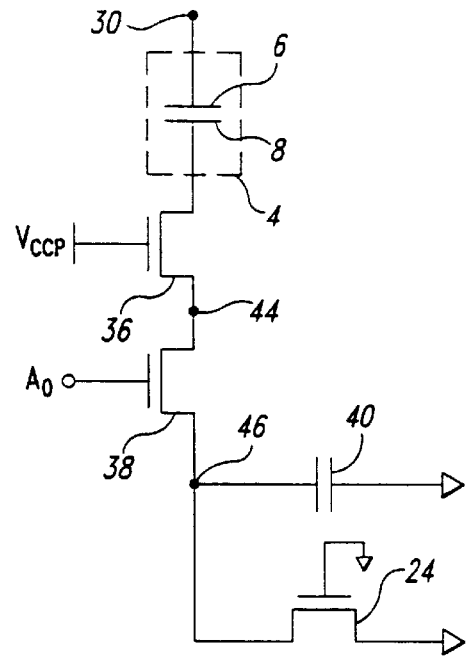
FIG. 2B is a simplified schematic diagram of one part of the substitute address enabling array in FIG. 2A.
Figure 2C:
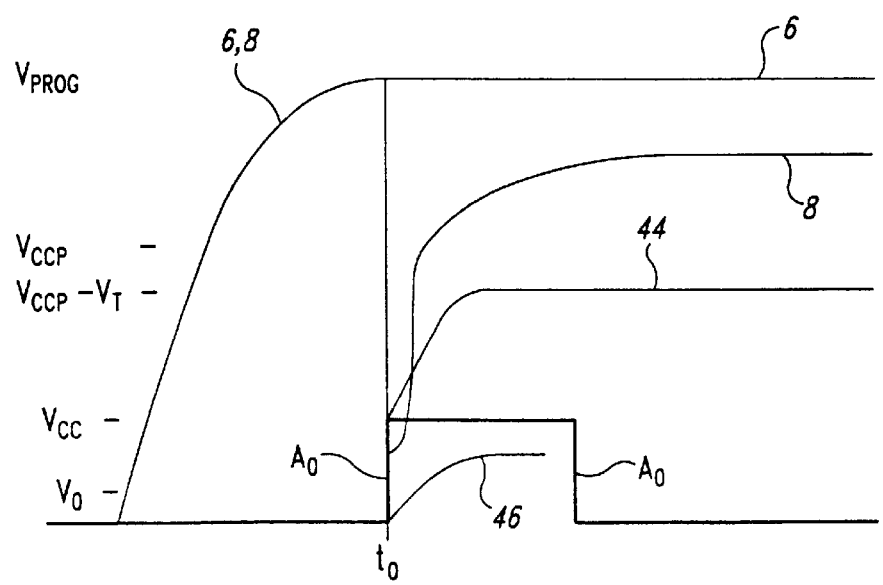
FIG. 2C is a voltage-time diagram showing the voltages at various points during the programming step of the enabling array according to the prior art.
Figure 3A:
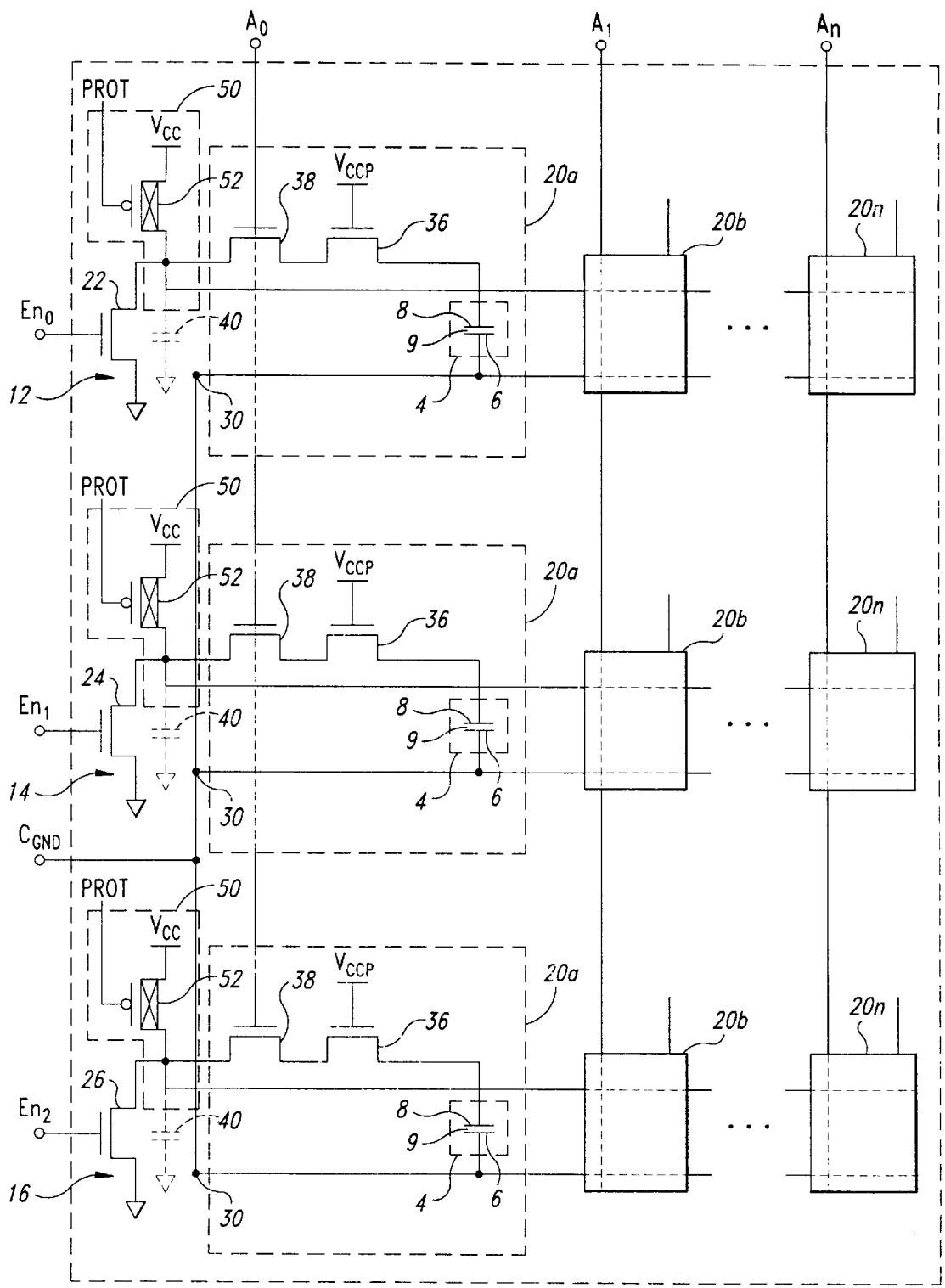
FIG. 3A is a schematic diagram of a substitute address enabling array including an antifuse device and an embodiment of a non-selection protection circuit according to the present invention.

FIG. 3A shows an embodiment of the invention including all of the prior art circuitry shown in FIG. 2A and a protection circuit 50 according to one embodiment of the present invention. The protection circuit 50 includes a PMOS charging transistor 52 that applies a charge voltage to the parasitic capacitance 40 of the non-selected bank select transistors 22, 24, 26. The gate of the charging transistor 52 is coupled to a protection input PROT which is driven low by external circuitry (not shown) for all of the banks 12, 14, 16 prior to the time when the antifuses 4 of a selected bank 12 are being programmed. In an alternative embodiment, the charge voltage is applied to the parasitic capacitances 40 of only the non-selected banks 14, 16 prior to and during the programming of the selected bank 12. The charging transistor 52 is not limited to PMOS and can be implemented in another technology type, such as NMOS.

Figure 3B:
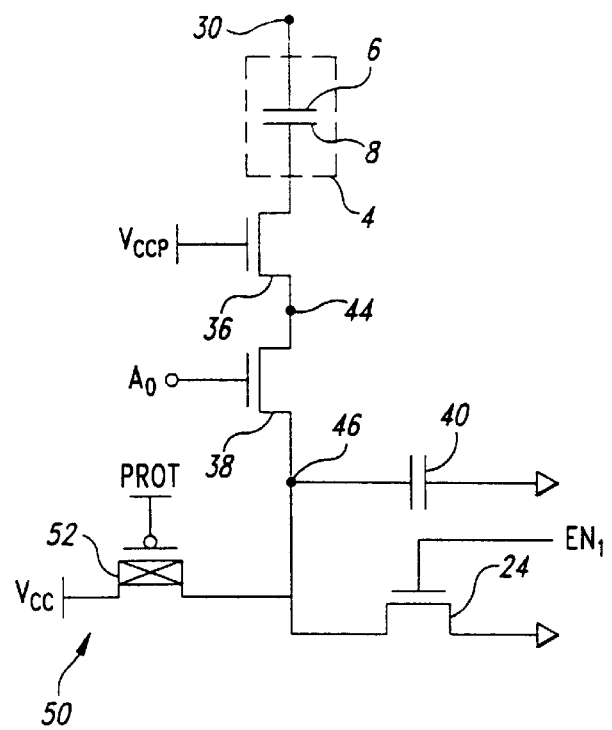
FIG. 3B is a simplified schematic diagram of one part of the substitute address enabling array of FIG. 3A.
Figure 3C:
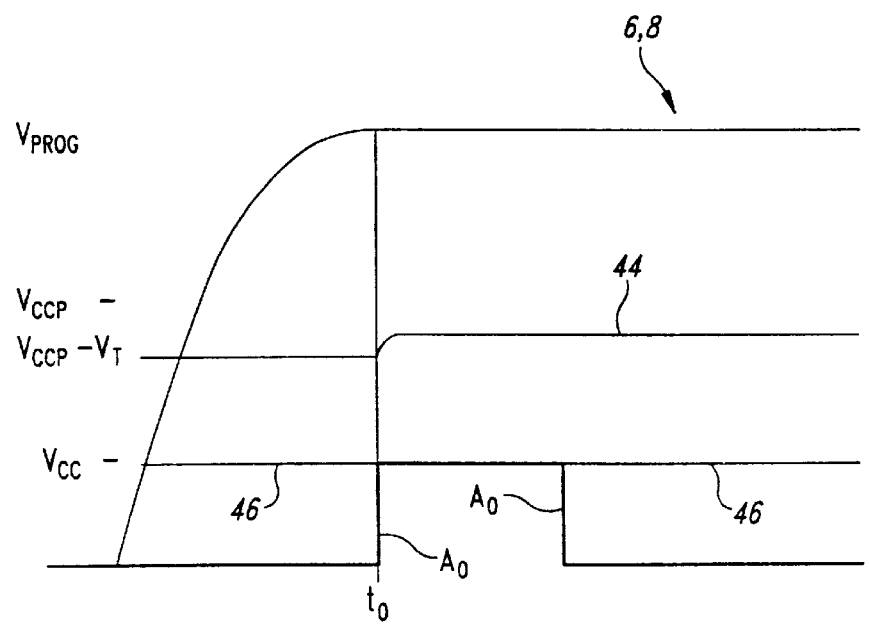
FIG. 3C is a voltage-time diagram showing the voltages at various points during the programming step according to the present invention.

The operation of the circuit of FIG. 3A is best explained with reference to the equivalent schematic of FIG. 3B and the waveform diagram of FIG. 3C. As in the circuit of FIG. 2A, the programming voltage is applied to the circuit ground node 30 that is connected to the plate 6 of the antifuse 4 and to the $C_{GND}$ input. The bank select transistor 22 is OFF while the transistor 36 is ON at this time although it is subsequently turned ON. Before the antifuse select transistor 38 is turned ON, the PROT input is driven low by external circuitry to briefly turn ON the charging transistor 52. Current then flows through the charging transistor 52 to charge the parasitic capacitance 40 so that the voltage at the bank select node 46 rises high enough to prevent the antifuse select transistor 38 from turning on for non-selected banks 14, 16. For example, the voltage at the bank select node 46 could rise to $V_{CC}$ as shown in FIG. 3C.

After the charging transistor 52 has been turned OFF, the array 48 is programmed in the same manner as the prior art circuit of FIG. 2A. In particular, when the programming voltage is applied to the circuit ground $C_{GND}$ input, the voltage on the plates 6, 8 of the antifuse 4 rises to $V_{PROG}$. The bank select transistor 22 (FIG. 3A) for the selected bank 12 is then turned ON to select the antifuses 4 in one of the banks, for example bank 12, for programming. At time $t_0$, the antifuse select transistor 38 is turned ON by driving $A_0$ high from an external circuit. When $A_0$ goes high, the antifuse 4 in the programming circuit 20 is programmed as described above. When the antifuse select transistor 38 is turned ON for a non-selected bank, for example bank 14, signals are generated at various nodes of the programming circuit 20a (FIG. 3B) as shown in FIG. 3C. The voltage at node 44 rises to $V_{CCP}-V_T$ as in the prior art circuit of FIG. 2A. However, since $A_0$ and the voltage at the bank select node 46 are both at $V_{CC}$, the antifuse select transistor 38 is maintained in an OFF state, thereby isolating the plate 8 of the antifuse 4 from the parasitic capacitance 40. As a result, no current can flow through the antifuse 4 to inadvertently program it. Also, a portion of the signal $A_0$ is capacitively coupled to the node 44 to raise its voltage above $V_{CCP}-V_T$ since the node 44 is essentially floating. Moreover, even if the antifuse select transistor 38 was turned ON, precharging the parasitic capacitance 40 would markedly reduce the current through the antifuse 4 because the change in voltage across the parasitic capacitance 40, and hence the current through the capacitance 40, would be relatively small.

Figure 4:
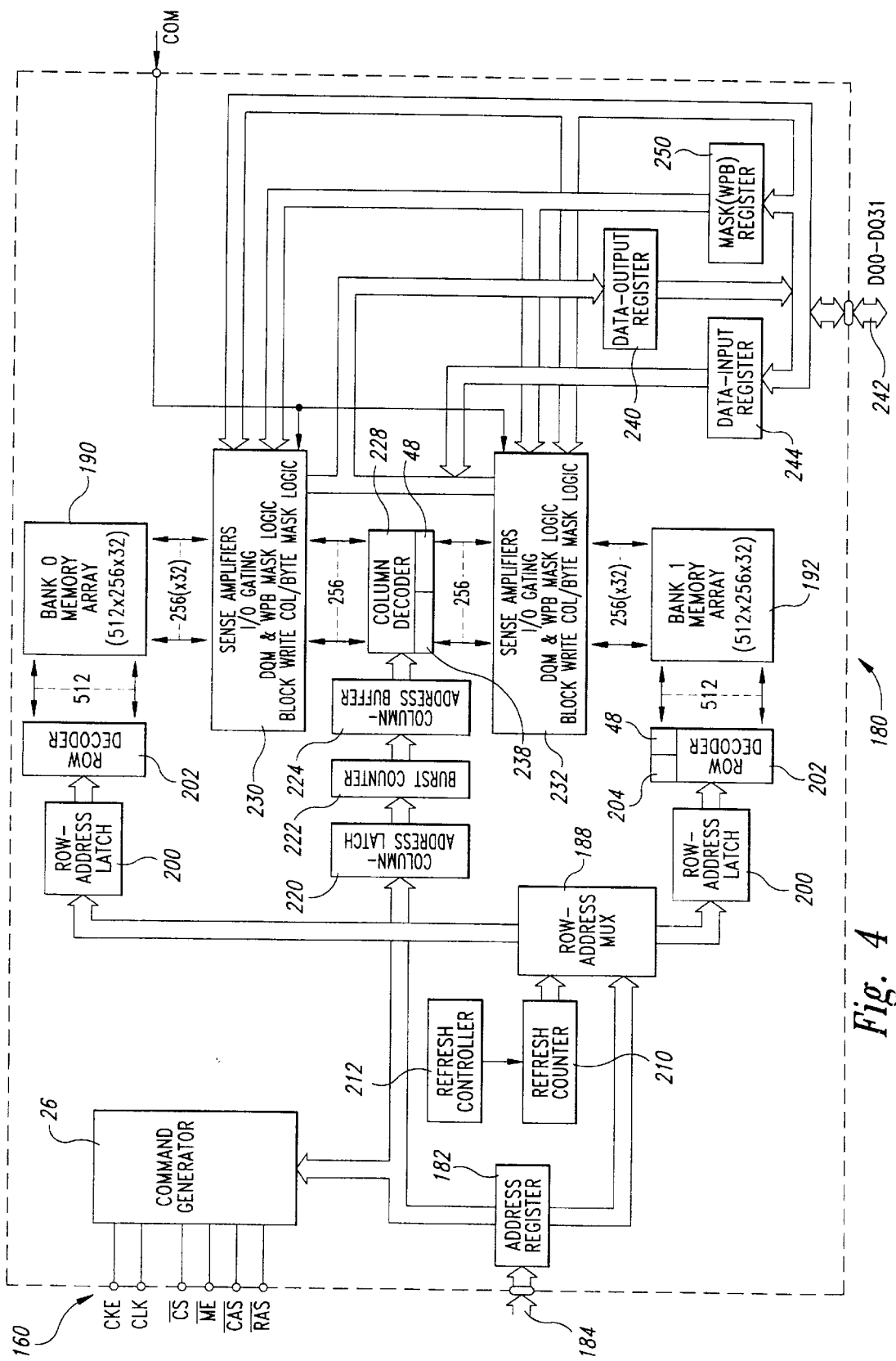
FIG. 4 is a block diagram of a DRAM which includes the substitute memory cell enabling array of FIG. 3A.

A synchronous DRAM ("SDRAM") 180 using the substitute memory cell enabling array 48 of FIG. 3A is shown in FIG. 4. The SDRAM 180 includes an address register 182 that receives either a row address or a column address on an address bus 184. The address bus 184 is generally coupled to a memory controller (not shown in FIG. 4). A row address is initially received by the address register 182 and applied to a row address multiplexer 188. The row address multiplexer 188 couples the row address to a number of components associated with either of two memory banks 190, 192 depending upon the state of a bank address bit BA forming part of the row address. Associated with each of the memory banks 190, 192 are a respective row address latch 200 which stores the row address, and a row decoder 202 which applies various row signals to its respective array 190 or 192 as a function of the stored row address. The row address multiplexer 188 also couples row addresses to the row address latches 200 for the purpose of refreshing the memory cells in the arrays 190, 192. The row addresses are generated for refresh purposes by a refresh counter 210 which is controlled by a refresh controller 212. As also shown in FIG. 4, the row decoders 202 each also includes a conventional substitute row decoding circuit 204 which interfaces with the substitute memory cell enabling array 48 of FIG. 3A in a conventional manner. It is the substitute row decoding circuit 204 that supplies signals to the substitute memory cell enabling array 48 as described above with reference to FIG. 3A.

After the row address has been applied to the address register 182 and stored in one of the row address latches 200, a column address is applied to the address register 182. The address register 182 couples the column address to a column address latch 220. Depending on the operating mode of the SDRAM 180, the column address is either coupled through a burst counter 222 to a column address register 224 or to the burst counter 222 which applies a sequence of column addresses to the column address buffer 224 starting at the column address output by the address register 182. In either case, the column address buffer 224 applies a column address to a column decoder 228 which applies various column signals to respective sense amplifiers and associated circuitry 230, 232 for the respective arrays 190, 192. The column decoder 228 also includes a conventional substitute column decoding circuit 238 which interfaces with the substitute memory cell enabling array 48 of FIG. 3A in a conventional manner. As with the substitute row decoding circuit 204, the substitute column decoding circuit 238 supplies signals to the substitute memory cell enabling array.

The column circuitry 230, 232 receive data from the arrays 190, 192, respectively, and couple the data to a data output register 240 which applies the data to a data bus 242. Data to be written to one of the arrays 190, 192 is coupled from the data bus 242 through a data input register 244 to the column circuitry 230, 232 where it is transferred to one of the arrays 190, 192, respectively. A mask register 250 may be used to selectively alter the flow of data into and out of the column circuitry 230, 232 such as by selectively masking data to be read from the arrays 190, 192.

The above-described operation of the SDRAM 180 is controlled by the Command Generator 26 responsive to high level command signals received on a control bus 160. These high level command signals, which are typically generated by a memory controller (not shown in FIG. 4), are a clock enable signal CKE*, a clock signal CLK, a chip select signal CS*, a write enable signal WE*, a row address strobe signal RAS*, and a column address strobe signal CAS*, with the "*" designating the signal as active low. However, other high level command signals may be used. In either case, the Command Generator 26 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

Although the substitute memory cell enabling array 48 has been described as being used in a SDRAM 180, it will be understood that it may also be used in other types of integrated circuits, including other types of memory devices such as asynchronous DRAMs, video DRAMs, etc.

Figure 5:
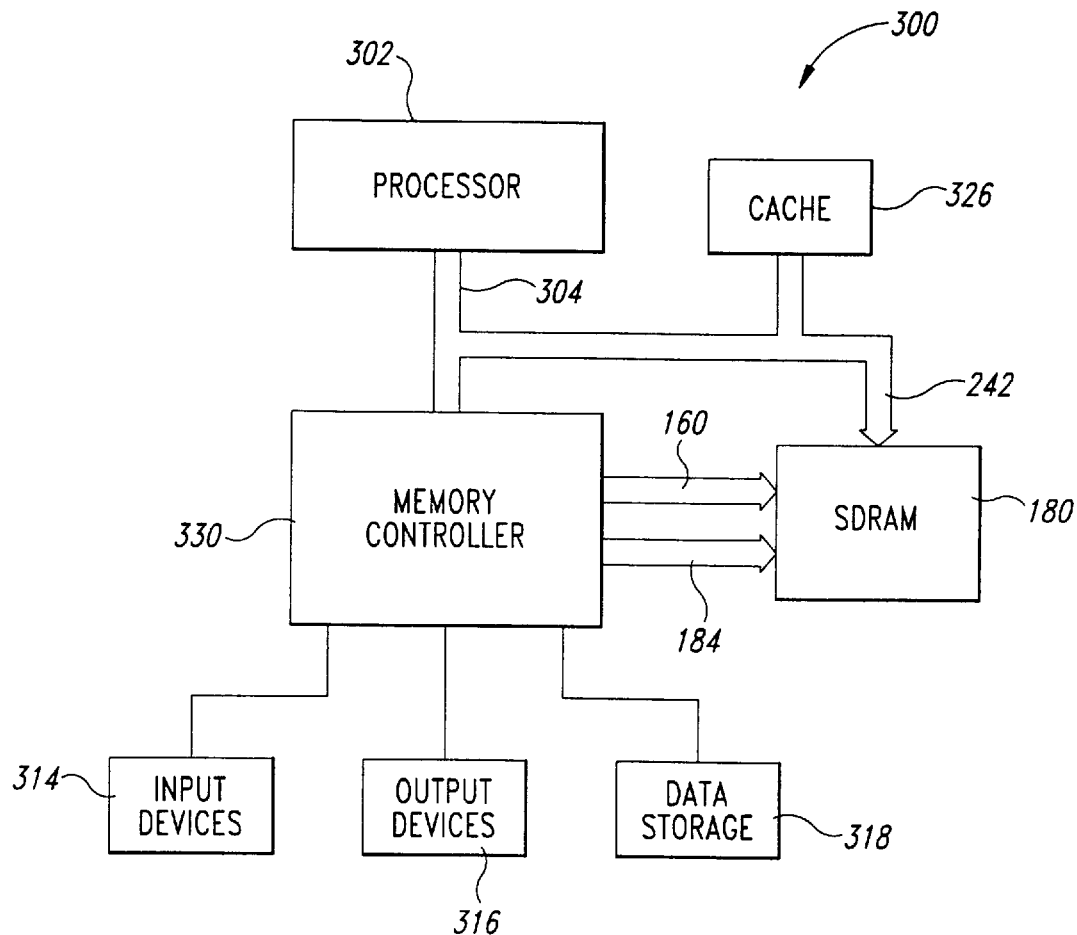
FIG. 5 is a block diagram of a computer system containing the DRAM of FIG. 4.

FIG. 5 is a block diagram of a computer system 300 which includes the SDRAM 180 of FIG. 4. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the SDRAM 180 through a memory controller 330. The memory controller 330 normally includes the control bus 160 and the address bus 184 that is coupled to the SDRAM 180. The data bus 242 may be coupled to the processor bus 304 either directly (as shown), through the memory controller 330, or by some other means.

We claim:

1. In an integrated circuit having a plurality of banks of one-time programmable elements in which the programmable elements in a selected bank are programmed to allow the selected bank of programmable elements to enable a respective circuit responsive to receiving a corresponding set of control signals, a protection circuit for protecting the programmable elements in a non-selected bank from being programmed during the programming of programmable elements in the selected bank, comprising:

a programming node coupled to one terminal of each of the programmable elements, the programming node adapted to receive a programming voltage and apply the programming voltage to the programmable elements;

a plurality of programmable element select switches, the programmable element select switches in each bank being coupled between a respective bank select node for each bank and a second terminal of a respective programmable element, the programmable element select switches each having a control terminal adapted to receive a respective control signal to close the programmable element select switch, the control terminals of corresponding programmable element select switches in each bank being coupled to each other so that each control signal is applied to the corresponding programmable elements in a plurality of the banks;

a plurality of bank select switches coupling respective bank select nodes to a reference voltage responsive to a respective bank select signal; each of the bank select switches having a parasitic capacitance between the bank select node and the reference voltage; and a plurality of charging circuits coupled to respective bank select nodes, the charging circuits applying a charging voltage to respective parasitic capacitances of the bank select switches prior to the programming of a selected bank of programming elements.

2. The protection circuit of claim 1 wherein the programmable element select switches in each bank are closed when the difference between the voltage of the control signal applied to each programmable element select switch and the voltage of the bank select node is more than a predetermined voltage, and wherein the charging circuits are adapted to charge the respective parasitic capacitances to a voltage such that the difference between the voltage of the control signal applied to each programmable element switch and the voltage of the bank select node is less than the predetermined voltage thereby maintaining the programmable element select switches in a non-conductive state.

3. The protection circuit of claim 1 wherein the programmable elements are antifuses each of which has a pair of plates separated from each other by a dielectric material.

4. The protection circuit of claim 1 wherein the circuit enabled by the respective bank of programmable elements comprises a redundant bank of memory cells in an array of memory cells in a dynamic random access memory.

5. The protection circuit of claim 1 wherein the charging circuits apply the charging voltage only to respective parasitic capacitances of the bank select switches that do not receive the bank select signal.

6. The protection circuit of claim 1 wherein the charging circuits apply the charging voltage to respective parasitic capacitances of the bank select switches that do not receive the bank select signal during the programming of the selected bank of programming elements.

7. In an integrated circuit having a plurality of banks of one-time programmable elements in which the programmable elements in a selected bank are programmed to allow the selected bank of programmable elements to enable a respective circuit responsive to receiving a corresponding set of control signals, a protection circuit for protecting the programmable elements in a non-selected bank from being programmed during the programming of programmable elements in the selected bank, comprising:

a programming node coupled to one terminal of each of the programmable elements, the programming node adapted to receive a programming voltage and apply the programming voltage to the programmable elements;

a plurality of programmable element select switches, the programmable element select switches in each bank being coupled between a respective bank select node for each bank and a second terminal of a respective programmable element, the programmable element select switches each having a control terminal adapted to receive a respective control signal to close the programmable element select switch, the control terminals of corresponding programmable element select switches in each bank being coupled to each other so that each control signal is applied to the corresponding programmable elements in a plurality of the banks;

a plurality of bank select switches coupling respective bank select nodes to a reference voltage responsive to a respective bank select signal; each of the bank select switches having a parasitic capacitance connected between the bank select node and the reference voltage;

a plurality of charging circuits coupled to respective bank select nodes, the charging circuits applying a charging voltage to respective parasitic capacitances of the bank select switches prior to the programming of a selected bank of programming elements; and a control circuit selectively generating the control signals and the bank select signals.

8. The protection circuit of claim 7 wherein the control circuit applies a bank select signal to the select switch for one of the banks of programmable elements prior to applying control signals to respective programmable element select switches.

9. The protection circuit of claim 7 wherein the control circuit applies a bank select signal to the select switch for one of the banks of programmable elements prior to applying control signals to respective programmable element select switches and after the programming voltage is applied to the programming node.

10. The protection circuit of claim 7 wherein the programmable element select switches in each bank are closed when the difference between the voltage of the control signal applied to each programmable element select switch and the voltage of the bank select node is more than a predetermined voltage, and wherein the charging circuits are adapted to charge the respective parasitic capacitances to a voltage such that the difference between the voltage of the control signal applied to each programmable element switch and the voltage of the bank select node is less than the predetermined voltage thereby maintaining the programmable element select switches in a non-conductive state.

11. The protection circuit of claim 7 wherein the programmable elements are antifuses each of which has a pair of plates separated from each other by a dielectric material.

12. The protection circuit of claim 7 wherein the circuit enabled by the respective bank of programmable elements comprises a redundant set of memory cells in an array of memory cells in a dynamic random access memory.

13. The protection circuit of claim 7 wherein the charging circuits apply the charging voltage only to respective parasitic capacitances of the bank select switches that do not receive the bank select signal.

14. The protection circuit of claim 7 wherein the charging circuits apply the charging voltage to respective parasitic capacitances of the bank select switches that do not receive the bank select signal during the programming of the selected bank of programming elements.

15. In an integrated circuit having a plurality of enable circuits each of which is adapted to enable a respective circuit responsive to receiving a set of control signals in respective predetermined patterns, the enable circuits comprising:

a plurality of one-time programmable elements corresponding in number to the number of control signals received by the enable circuits, the programmable elements in each enable circuit being adapted to be programmed by passing a current through selected programmable elements in a pattern corresponding to one of the predetermined patterns of control signals;

a programming node coupled to one terminal of each of the programmable elements, the programming node adapted to receive a programming voltage and apply the programming voltage to the programmable elements in all of the enable circuits;

a plurality of select transistors for each enable circuit, the select transistors being coupled between a bank select node and a second terminal of a respective programmable element, the select transistors each having a control terminal adapted to receive a respective control signal to turn the select transistor on when the difference between the voltage of the control signal applied to the control terminal and the voltage of the bank select node is less than a predetermined voltage, the control terminals of corresponding select transistors in the enable circuits being coupled to each other so that each control signal is applied to the control terminals of corresponding select transistors in a plurality of the enable circuits;

an enable circuit select transistor for each enable circuit, the enable circuit select transistor coupling the bank select node to a reference voltage responsive to receipt of an enable circuit select signal, each of the enable circuit select switches having a parasitic capacitance connected between the bank select node and the reference voltage;

a charging circuit for each enable circuit, the charging circuit coupled to the bank select nodes to apply a charging voltage to the parasitic capacitance of the enable circuit responsive to a charge signal; and a control circuit selectively generating the control signals, the enable circuit select signals, and the charge signals, the control circuit applying the predetermined pattern of control signals to a plurality of enable circuits, an enable circuit select signal to the enable circuit select transistor in one of the enable circuits, and a charge signal to the charging circuit of the plurality of enable circuits.

16. The enable circuits of claim 15 wherein the programming circuits each comprise a field effect transistor connected between a supply voltage and the bank select node of a respective enable circuit, the field effect transistor including a control terminal, the field effect transistor coupling the supply voltage to the bank select node responsive to the charge signal being applied to the control terminal of the field effect transistor.

17. The enable circuits of claim 16 wherein the field effect transistor comprises a PMOS transistor having a source connected to a positive supply voltage, a drain connected to the bank select node, and a gate receiving the charge signal.

18. The enable circuits of claim 15 wherein the control circuit applies an enable circuit select signal to the enable circuit prior to applying control signals to the enable circuits.

19. The enable circuits of claim 15 wherein the control circuit applies an enable circuit select signal to the enable circuit prior to applying control signals to the enable circuits and after the programming voltage is applied to the programming node.

20. The enable circuits of claim 15 wherein the select transistors in each enable circuit are closed when the difference between the voltage of the control signal applied to each select transistor and the voltage of the bank select node is more than a predetermined voltage, and wherein the charging circuit in each enable circuit is adapted to charge the parasitic capacitance to a voltage such that the difference between the voltage of the control signal applied to each select transistor and the voltage of the bank select node is less than the predetermined voltage thereby maintaining the select transistor in a non-conductive state.

21. The enable circuits of claim 15 wherein the programmable elements are antifuses each of which has a pair of plates separated from each other by a dielectric material.

22. The enable circuits of claim 15 wherein the circuit enabled by the respective bank of programmable elements comprises a redundant set of memory cells in an array of memory cells in a dynamic random access memory.

23. The enable circuits of claim 15 wherein the charge signal is applied to the charging circuit of the plurality of enable circuits except to the enable circuit receiving the enable circuit select signal.

24. A computer system, comprising:
 a processor;
 an input device coupled to the processor adapted to allow data to be input to a processor;
 an output device coupled to the processor adapted to allow the processor to output data;
 a storage device coupled to the processor adapted to store information for use by the processor; and
 a memory device coupled to the processor for storing data and instructions for use by the processor, the memory device comprising:
  a plurality of storage cells;
  a plurality of banks of one-time programmable elements in which the programmable elements in a selected bank are programmed to allow the selected bank of programmable elements to enable a set of the memory cells responsive to receiving a corresponding set of control signals;
  a programming node coupled to one terminal of each of the programmable elements, the programming node adapted to receive a programming voltage and apply the programming voltage to the programmable elements;
  a plurality of programmable element select switches, the programmable element select switches in each bank being coupled between a respective bank select node for each bank and a second terminal of a respective programmable element, the programmable element select switches each having a control terminal adapted to receive a respective control signal to close the programmable element select switch, the control terminals of corresponding programmable element select switches in each bank being coupled to each other so that each control signal is applied to the corresponding programmable elements in a plurality of the banks;
  a plurality of bank select switches coupling respective bank select nodes to a reference voltage responsive to a respective bank select signal; each of the bank select switches having a parasitic capacitance connected between the bank select node and the reference voltage;
  a plurality of charging circuits coupled to respective bank select nodes, the charging circuits applying a charging voltage to respective parasitic capacitances of the bank select switches prior to the programming of a selected bank of programming elements; and
  a control circuit selectively generating the control signals and the bank select signals.

25. The computer system of claim 24 wherein the control circuit applies a bank select signal to the select switch for one of the banks of programmable elements prior to applying controls signals to respective programmable element select switches.

26. The computer system of claim 24 wherein the control circuit applies a bank select signal to the select switch for one of the banks of programmable elements prior to applying controls signals to respective programmable element select switches and after the programming voltage is applied to the programming node.

27. The computer system of claim 24 wherein the programmable element select switches in each bank are closed when the difference between the voltage of the control signal applied to each programmable element select switch and the voltage of the bank select node is more than a predetermined voltage, and wherein the charging circuits are adapted to charge the respective parasitic capacitances to a voltage such that the difference between the voltage of the control signal applied to each programmable element switch and the voltage of the bank select node is less than the predetermined voltage thereby maintaining the programmable element select switches in a non-conductive state.

28. The computer system of claim 24 wherein the programmable elements are antifuses each of which has a pair of plates separated from each other by a dielectric material.

29. The computer system of claim 24 wherein the charging circuits apply the charging voltage only to respective parasitic capacitances of the bank select switches that do not receive the bank select signal.

30. The protection circuit of claim 24 wherein the charging circuits apply the charging voltage to respective parasitic capacitances of the bank select switches that do not receive the bank select signal during the programming of the selected bank of programming elements.

31. In an integrated circuit having a plurality of banks of one-time programmable elements to allow a selected bank of programmable elements to be programmed to enable a respective circuit responsive to receiving a corresponding set of control signals, the integrated circuit further including a programming node coupled to one terminal of each of the programmable elements, a plurality of programmable element select switches, the programmable element select switches in each bank being coupled between a respective bank select node for each bank and a second terminal of a respective programmable element, and a plurality of bank select switches adapted to couple respective bank select nodes to a reference voltage responsive, each of the bank select switches having a parasitic capacitance connected between the bank select node and the reference voltage, a method of programming programmable elements in a selected bank while protecting the programmable elements in a non-selected bank from being programmed, the method comprising:
 applying a programming voltage to the programming node;
 closing one of the plurality of bank select switches thereby coupling the respective bank select node to the reference voltage while leaving a plurality of other bank select switches open;
 closing the programmable element select switches for all of the banks of programmable elements in a common predetermined pattern; and
 applying a charging voltage to respective parasitic capacitances of the bank select switches that are left open.

32. The method of claim 31 wherein the method further comprises closing the bank select switch prior to closing the programmable element select switches.

33. The method of claim 31 wherein the method further comprises closing the bank select switch prior to closing the programmable element select switches and after applying the programming voltage to the programming node.

34. The method of claim 31 wherein the step of applying the programming voltage to the programming node further comprises applying a positive voltage to the programming node.

35. The method of claim 31 wherein the step of closing the programmable element select switches comprises closing the programmable element select switches when the voltage of the bank select node is less than a predetermined voltage, and wherein the step of applying a charging voltage to respective parasitic capacitances further comprises charging the parasitic capacitance to a voltage that is greater than the predetermined voltage thereby maintaining the programmable element select switches in a non-conductive state.

36. In an integrated circuit having a plurality of banks of one-time programmable elements to allow a selected bank of programmable elements to be programmed to enable a respective circuit responsive to receiving a corresponding set of control signals, the integrated circuit further including a programming node coupled to one terminal of each of the programmable elements, a respective bank select node for each bank selectively coupled to a second terminal of the respective programmable element in the bank, and a parasitic capacitance between the bank select node of each bank and a reference voltage, a method of programming programmable elements in a selected bank while protecting the programmable elements in a non-selected bank from being programmed, the method comprising:

applying a programming voltage to the programming node;

coupling the bank select node in the selected bank to the reference voltage while leaving the bank select nodes in a plurality of non-selected banks isolated from the reference voltage;

selectively coupling all of the banks of programmable elements to respective bank select nodes in a common predetermined pattern; and applying a charging voltage to respective parasitic capacitances in the non-selected banks.

37. The method of claim 36 wherein the method further comprises coupling the bank select node in the selected bank to the reference voltage prior to selectively coupling all of the banks of programmable elements to respective bank select nodes.

38. The method of claim 36 wherein the method further comprises coupling the bank select node in the selected bank to the reference voltage prior to selectively coupling all of the banks of programmable elements to respective bank select nodes and after applying the programming voltage to the programming node.

39. The method of claim 36 wherein the step of applying the programming voltage to the programming node further comprises applying a positive voltage to the programming node.

40. The method of claim 36 wherein the step of coupling the bank select node in the selected bank to the reference voltage further comprises coupling the bank select node in the selected bank to ground potential.

41. The method of claim 36 wherein the step of selectively coupling all of the banks of programmable elements to respective bank select nodes comprises selectively coupling all of the banks of programmable elements to respective bank select nodes when the voltage of the bank select node is less than a predetermined voltage, and wherein the step of applying a charging voltage to respective parasitic capacitances further comprises charging the parasitic capacitance to a voltage that is greater than the predetermined voltage.

* * * * *